United States Patent [19]

Tomassetti

[11] Patent Number: 4,912,054
[45] Date of Patent: Mar. 27, 1990

[54] INTEGRATED BIPOLAR-CMOS CIRCUIT ISOLATION PROCESS FOR PROVIDING DIFFERENT BACKGATE AND SUBSTRATE BIAS

[75] Inventor: Stephen R. Tomassetti, Lewisville, Tex.

[73] Assignee: Texas Instruments Incorporated, Dallas, Tex.

[21] Appl. No.: 294,330

[22] Filed: Jan. 6, 1989

Related U.S. Application Data

[62] Division of Ser. No. 55,480, May 28, 1987, Pat. No. 4,825,275.

[51] Int. Cl.$^4$ ............... H01L 21/22; H01L 21/283
[52] U.S. Cl. ........................... 437/31; 437/34; 437/56; 437/74
[58] Field of Search .......... 357/34, 35, 43; 437/26, 437/34, 31, 56, 57, 58, 59, 74

[56] References Cited

U.S. PATENT DOCUMENTS

| | | |
|---|---|---|
| 3,999,213 | 12/1976 | Brandt et al. ............ 357/43 |
| 4,684,970 | 8/1987 | Sloane et al. ............ 357/35 |
| 4,721,682 | 1/1988 | Graham et al. ............ 437/33 |
| 4,825,275 | 4/1989 | Tomasetti ............ 357/43 |

FOREIGN PATENT DOCUMENTS

| | | | |
|---|---|---|---|
| 3002797 | 7/1981 | Fed. Rep. of Germany | 437/74 |
| 0131559 | 6/1987 | Japan | 437/74 |
| 0072151 | 4/1988 | Japan | 437/74 |

Primary Examiner—Brian E. Hearn
Assistant Examiner—T. N. Quach
Attorney, Agent, or Firm—Carlton H. Hoel; Thomas W. DeMond; Melvin Sharp

[57] ABSTRACT

Disclosed is a proces for making a bipolar-CMOS circuit which includes a NMOS transistor site (18) electrically isolated from a bipolar transistor site (16). The NMOS transistor site (18) includes a semiconductor region (24) isolated from a bipolar transistor well (26) by deep diffusion ring (32). A buried layer (13) forms a bottom of the deep diffusion isolation ring (32). A backgate voltage can be applied to the isolated semiconductor region (24) of the NMOS device, which bias may be different than that applied to the substrate (10). Optimum performance of the NMOS transistor is thus assured irrespective of the magnitude of operating voltage of the bipolar transistor.

15 Claims, 1 Drawing Sheet

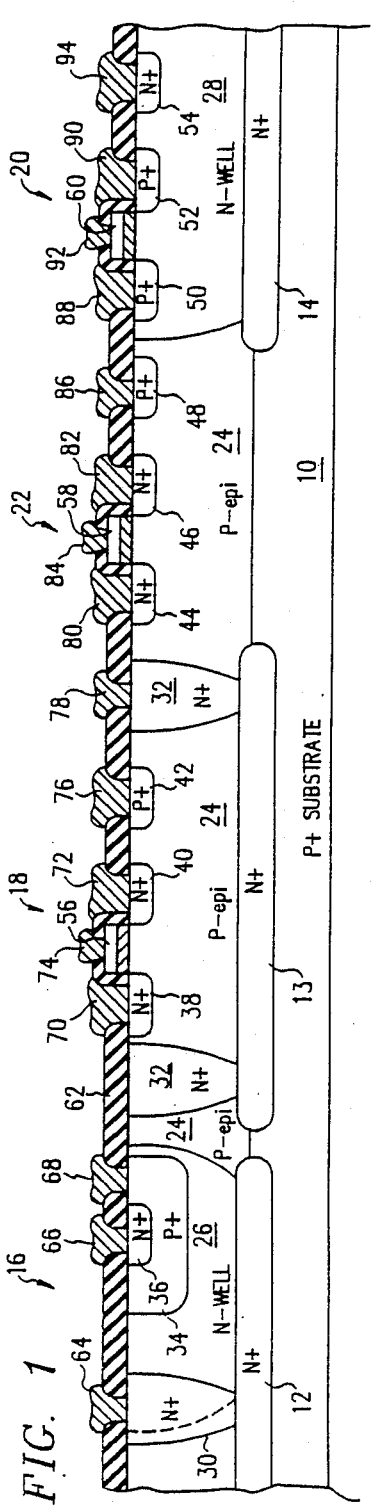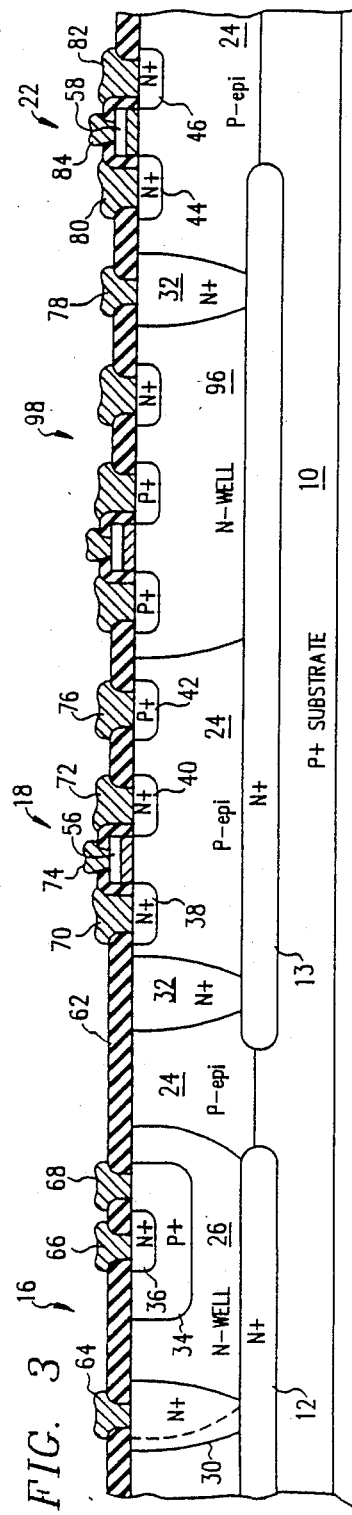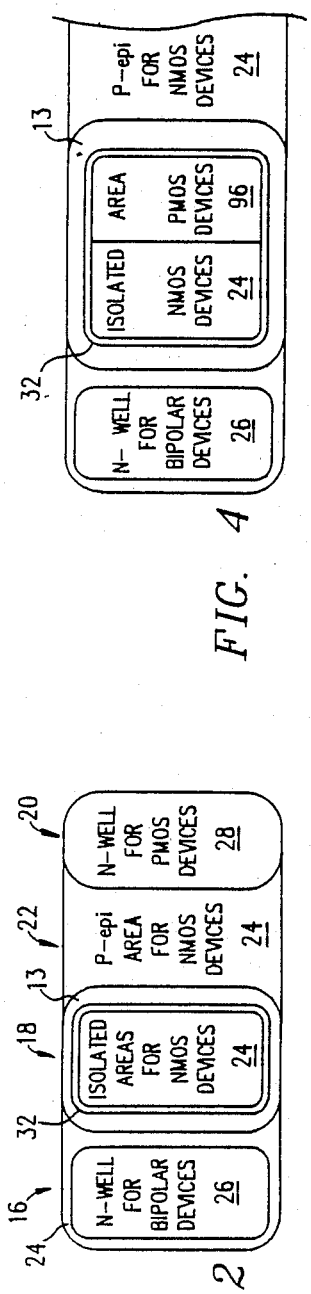

INTEGRATED BIPOLAR-CMOS CIRCUIT ISOLATION PROCESS FOR PROVIDING DIFFERENT BACKGATE AND SUBSTRATE BIAS

This is a division of application Ser. No. 055,480, filed May 28, 1987, now U.S. Pat. No. 4,825,275.

TECHNICAL FIELD OF THE INVENTION

The present invention relates in general to semiconductor fabrication techniques and resulting structures, and more particularly relates to apparatus and techniques for biasing integrated bipolar-CMOS semiconductor circuits utilizing different operating voltages.

BACKGROUND OF THE INVENTION

The well-established MOS family of semiconductors circuits has significantly improved the integration of a large number of circuits into a single chip. The speed of MOS circuits is enhanced by integrating P-channel (PMOS) and N-channel (NMOS) devices together to form CMOS circuits. The operation of a CMOS circuit is optimized by forming a totem pole type of output structure, with the PMOS device connected to its supply voltage and the NMOS device connected to ground. The NMOS circuit provides optimum performance with regard to speed, when its backgate is connected to a semiconductor source terminal. In like manner, the backgate of the PMOS circuit is connected to its source terminal, and thus to the supply voltage.

Bipolar transistor devices are characterized by high switching speeds and large output currents, but cannot be formed with the circuit density of that of MOS circuits. While both families of transistor circuits have become independently and highly developed, little effort has been directed to the integration of the circuits together. Some approaches have been taken to integrate linear or analog bipolar and MOS circuits on the same chip in which digital MOS circuits are formed. A problem which arises from this type of integration is the different operating voltage range between each family of circuits. In order to provide proper junction isolation between the semiconductor substrate and other semiconductor regions formed therein, such substrate, if P-type, is generally connected to the most negative potential of the operating voltages. With linear bipolar circuits, or in other high voltage devices, the substrate is connected to a voltage which may be in the neighborhood of −10 to −15 volts. In integrated bipolar-CMOS circuits, such potential is also connected through the substrate to the backgate region of the NMOS circuits. When this occurs, the performance of the NMOS circuits are degraded. Moreover, the electric field generated across the gate insulators thereof may become excessive and damage the NMOS circuits. This problem does not occur in the PMOS circuits, as such circuits are generally formed in an N-well which becomes reverse biased with respect to the P-type substrate, thereby providing an automatic isolation.

From the foregoing, a need exists for a technique to integrate linear bipolar and CMOS and digital CMOS circuits together by utilizing certain bipolar structures for isolating the analog circuits, thereby permitting the P-type substrate to be connected to a negative voltage to benefit the digital CMOS operation, thus permitting the backgate region of the digital NMOS circuits to be connected to the source terminals thereof for optimum operation.

SUMMARY OF THE INVENTION

In accordance with the present invention, the disclosed bipolar-CMOS fabrication method and structure substantially reduces or eliminates the disadvantages and shortcoming associated with the prior art techniques. A technical advantage presented by the invention is that process steps and structures of bipolar and CMOS devices are utilized with the CMOS circuits to provide isolation of the analog devices from the digital devices. An advantage with this technique and structure is that the backgate voltage connected to the NMOS devices can be independent of the voltage applied to the P-type substrate. Optimum performance of the NMOS devices of the CMOS structures is thus assured, while yet allowing negative or large voltages to be used with the bipolar-CMOS analog devices.

In fabricating the semiconductor structure of the invention, the source and drain regions of PMOS transistors are formed in an N-well of semiconductor material. The N-well is formed by the same steps which form the semiconductor collector region of the bipolar transistor. In forming high performance vertical bipolar devices in the substrate, deep diffusion collector regions are formed in contact with a heavily doped buried layer, which layer reduces the collector series resistance. During the formation of the bipolar buried layer and the deep diffusion collector region, a similar structure is formed for isolating a semiconductor well in which NMOS devices can be formed. Particularly, a heavily doped buried layer is formed beneath the P-well semiconductor area, with a heavily doped N-type diffusion ring which circumscribes the P-well, and which is in contact with the associated buried layer. This ring can be formed by the process steps utilized in forming the deep N+ collector of the bipolar transistors or the N-well of the PMOS transistors. The P-well of semiconductor material in which the NMOS devices are formed is thus junction isolated from the remainder of the substrate. The N-well in which the PMOS transistors are formed is inherently junction isolated by the N-well material and the P-type substrate. The source and drain regions of the NMOS transistors can be formed in the process step utilized in forming the emitter and base structures of the bipolar transistor.

In another embodiment of the invention, an N-well can be formed within the electrically isolated well of semiconductor material. The technical advantage of this technique is that both of the NMOS and PMOS devices formed within the electrically isolated region can be biased with backgate potentials independent of the devices formed in the semiconductor substrate located outside the isolation ring.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, regions or areas throughout the views, and in which:

FIG. 1 is a sectional view of a semiconductor substrate, illustrating the integrated bipolar and CMOS structure of the invention;

FIG. 2 illustrates a top layout view of the semiconductor structure of FIG. 1;

FIG. 3 is a sectional view illustrating an alternative embodiment of the invention in which both NMOS and PMOS devices are electrically isolated from the bipolar devices; and FIG. 4 is top layout view of the semiconductor structure depicted in FIG. 3.

DETAILED DESCRIPTION OF THE INVENTION

FIG. 1 is a cross-sectional view of a semiconductor wafer embodying the principles and concepts of the preferred embodiment of the invention. The illustrated semiconductor structure is formed starting with a P-type substrate 10. Heavily doped N-type buried layers 12, 13 and 14 are formed at selected areas within the substrate 10. For example, the heavily doped N-type buried layer 12 is formed in the substrate 10 in a bipolar transistor site 16, while buried layer 13 is formed in a site 18 selected for forming NMOS transistors. The N+ buried layers 12 and 13 are each shown formed common to the respective bipolar transistor site 16 and the NMOS transistor site 18. Additional buried layers, such as that identified by reference character 14, can be formed in the substrate 10 at areas in which it is desired to form PMOS transistors 20. The latchup immunity of CMOS circuits is enhanced with such heavily doped buried layers 14 formed underlying the PMOS devices. Other transistor sites 22 not associated with a buried layer may be utilized to form other NMOS transistors therein. The N+ buried layers 12, 13 and 14 may be formed with a thickness and impurity concentration suitable to obtain low resistance characteristics.

While not shown to scale, a thin P-type epitaxial layer 24 is formed over the substrate 10 and over the buried layers 12, 13 and 14. The epitaxial layer 24 is preferably formed with a thickness and impurity concentration suitable for forming NPN bipolar and NMOS transistors therein. At transistor sites 16 and 20, respective N-wells 26 and 28 are formed within the epitaxial layer 24. The N-wells 26 and 28 can be formed by diffusing an N-type impurity into the P-type epitaxial layer 24 to thereby counterdope such layer 24 and provide the N-type wells 26 and 28. Separate diffusions or ion implantations can be utilized to form the N-well 26 and the N-well 28 should different N-type concentrations be desired for forming the bipolar transistors at the site 16 and the PMOS transistors at the site 20.

The wafer is next masked and patterned to form heavily doped N+ deep diffusions 30 and 32. The deep diffusions 30 and 32 are formed through the epitaxial layer 24 in electrical contact with the underlying respective buried layers 12 and 13. Deep diffusions 30 and 32 are formed in the same process step. Importantly, deep diffusion 30 forms a deep collector associated with the bipolar transistor site 16, while deep diffusion 32 forms an isolation ring around the NMOS transistor site 18. While not shown in the sectional view of FIG. 1, the isolation ring 32 is essentially a single diffusion which surrounds the P-type epitaxial material layer 24 therein. Because the deep diffusion ring 32 extends from the top of the epitaxial layer 24 down to the buried layer 13, the P-type material 24 encircled thereby is isolated from the outlying epitaxial material 24, and the substrate 10.

As an alternative to the fabrication of the isolation ring 32 in the manner noted, such ring can also be formed when the N-wells 26 and 28 are formed. Essentially, an annular ring of an N-well diffusion would encircle the desired P-epi area to be isolated. When the isolation ring is formed with the N-well material, there is provided an extended operating voltage between the P-epi which is tied to the substrate 10 and the isolated P-epi and the isolated P-epi within the N-well isolation ring.

The various source and drain semiconductor regions of the PMOS and NMOS transistors, and backgate contact regions can be formed in the same process steps by which the base and emitter regions of the bipolar transistor are formed. The wafer site 16 in which bipolar transistors are formed includes a P-type semiconductor base region 34 formed within the N-well 26. A base-collector conjunction is thereby formed. Formed within the semiconductor base region 34 is an N-type emitter region 36, thereby defining a base-emitter junction of the bipolar transistor.

Formed within the junction isolated wafer site 18 is an NMOS transistor, including N+ source and drain regions 88 and 40, as well as a P+ semiconductor backgate connection area 42. The wafer site 22 defines an area in which NMOS transistors can be formed. The backgate region of such transistors may not be isolated from the substrate 10. The NMOS transistors formed in wafer site 22 include N+ source and drain regions 44 and 46, as well as a P+ semiconductor backgate connection region 48. Formed in wafer area 20 are the PMOS transistors of the CMOS combination. The PMOS transistors include P+ source and drain regions 50 and 52 formed within the N-well 28. A heavily dope N. backgate connection region 54 is also formed in the N-well 28.

The P+ backgate areas 42 and 48 formed within the respective wafer sites 18 and 22 can be formed in the same process step which forms the bipolar transistor base region 34. The P+ source and drain regions 50 and 52 of the PMOS transistor in wafer site 20 can be formed simultaneously with the bipolar transistor base region 34. Formed simultaneously with the N-type emitter 36 of the bipolar transistor of wafer site 16 are the source and drain regions 38, 44 and 40, 46 of the NMOS transistors in wafer sites 18 and 22. The N+ backgate region 54 of the N-well 28 defining wafer site 20 is also formed in the same step in which the bipolar emitter 36 is formed.

In accordance with conventional semiconductor processing techniques, the source and drain regions of the CMOS devices formed within wafer sites 18, 20 and 22 are formed self-aligned with respect to corresponding gate conductors 56, 58 and 60. An insulating layer 62 is formed over the surface of the wafer, and patterned to define contact openings to the various semiconductor regions. For example, the bipolar transistor contacts in wafer site 16 include a collector contact 64, an emitter contact 66 and a base contact 68. The exemplary NMOS transistor in wafer site 18 includes a source region contact 70, drain region contact 72 and a gate contact 74. A backgate contact 76 is also provided for making electrical contact with the isolated epitaxial region 24. Also, the isolation ring 32 has formed therein an electrical contact 78.

The NMOS transistor formed in wafer site 22 includes a source contact 80, a drain contact 82 and a gate contact 84. Contact to the P-type epitaxial layer 24 is made via backgate contact 86. In like manner, the PMOS transistor formed in wafer site 20 includes a source contact 88, a drain contact 90 and a gate contact 92. Contact is made to the N-well 28 via a backgate contact 94.

In bipolar-CMOS circuits, the digital logic functions can be carried out by the CMOS circuits, while high voltage logic or analog functions can be carried out with the bipolar and/or CMOS devices. For example, with integrated circuit chips utilizing onboard drivers and receivers, the functions of the bipolar-CMOS circuits are integrated, in that the large voltage sing and high current of the drivers and receivers are carried out by the bipolar devices, while such drivers and receivers are connected to CMOS digital circuits for processing such signals in accordance with predetermined logic functions. In such an application, the advantages of the invention are realized by connecting the substrate 10 of the exemplary wafer to the most negative voltage utilized by the drivers or receivers, namely a voltage ranging from about −5 to −15 volts. Thus, the negative excursion of an analog signal can approach such negative voltage. The negative voltage applied to the substrate 10 has no effect on the NMOS devices formed in the isolated wafer site 18. The isolation ring 32 is connected, via contact 78, to the most positive voltage applied to the chip, and thereby reverse biases the PN junction formed between the N+ buried layer 13 and the P+ substrate 10. The impurity concentrations of the N+ buried layer and the P+ substrate 10 define, in part, the reverse breakdown voltage of the junction which limits the maximum voltage which can be applied between the isolation ring 78 and the P+ substrate 10. When the NMOS transistor backgate is thus biased, desired junctions remain reverse biased, thus preventing majority carrier current flow in the backgate region 24. This also prevents debiasing effects which can also lead to CMOS circuit latchup.

The NMOS transistor devices formed within the isolated wafer site 18 function optimally when the backgate area 24 is connected to the semiconductor source region 38. For digital CMOS devices, the NMOS source 38 is connected via the contact 70, to ground, as is the backgate contact 76. Thus, the NMOS transistors formed in the isolated wafer site 18 are connected to function optimally, without concern as to the magnitude of the voltage connected to the substrate 10. The isolated NMOS transistors in wafer site 18, as well as the NMOS transistors in wafer site 22, can be interconnected with the PMOS devices of wafer site 20 to provide CMOS devices. The bipolar devices in the wafer site 16 can be interconnected, as desired, to perform particular functions.

A top layout view of the wafer semiconductor regions of FIG. 1 is illustrated in FIG. 2. The isolated site 18, comprising the P-type epitaxial area 24, is shown electrically insulated by the isolation diffusion ring 32. As noted above, a buried layer 13 underlies the isolated epitaxial region 24, which buried layer 13 is contiguous with the isolation ring 32. Bipolar devices can be formed in the N-well 26 which defines wafer site 16. PMOS transistors of the CMOS pair can be formed in the N-well 28 of the wafer site 20. Lastly, other NMOS devices can be formed in the P-type epitaxial region 24 which defines the optional wafer site 22.

Another embodiment of the invention is illustrated in FIG. 3. Here, an N-well 96 is formed within the isolated P-type epitaxial region 24 and is thereby electrically isolated from the circuits lying outside of the isolation ring 32. Isolated PMOS transistors, such as indicated by device 98, can be formed in the isolated wafer site 18. The PMOS transistor 98 can be connected with other NMOS devices which are also formed in the isolated wafer site 18 in the P-type epitaxial area 24.

A top layout view of the wafer semiconductor regions illustrated in FIG. 3 is shown in FIG. 4. As can be seen, the isolation ring 32 encircles the isolated NMOS devices in semiconductor region 24 and the PMOS devices in semiconductor region 96. Formed outside the isolated regions are the NMOS devices in semiconductor region 24 and the bipolar devices in semicodductor region 26.

It is to be understood that the foregoing illustrations are for purposes of example only, as the size and location of the various wafer sites can be arranged for desired purposes. Impurity concentration and thicknesses of the various structures of the devices can be fabricated according to conventional techniques to form devices with desired electrical characteristics.

While the preferred embodiment of the invention has been disclosed with reference to a specific semiconductor structure and method, it is to be understood that many changes in detail may be mad as a matter of engineering choices without departing from the spirit and scope of the invention, as defined by the appended claims.

What is claimed is:

1. A method for fabricating a bipolar-CMOS circuit, comprising the steps of:
   forming a bipolar transistor in a semiconductor substrate;
   forming a CMOS circuit comprising a PMOS transistor and an NMOS transistor in the substrate;
   electrically isolating the NMOS transistor from the substrate by forming a semiconductor isolation ring around said NMOS transistor;
   forming a connection to the substrate for connection thereof to a voltage source; and
   forming a different connection to the isolated NMOS transistor for providing a backgate bias to the NMOS transistor, said backgate bias being of a different magnitude than said voltage source, whereby the substrate can be biased with a voltage different than a voltage applied to the NMOS transistor backgate.

2. The method of claim 1 further including connecting the backgate of the NMOS transistor to a semiconductor source region of the NMOS transistor.

3. The method of claim 2 further including grounding the source region of the NMOS transistor.

4. The method of claim 1 further including connecting the backgate and a semiconductor source region of the NMOS transistor to ground, and connecting the substrate to a negative voltage.

5. A method for fabricating a bipolar-CMOS semiconductor circuit, comprising the steps of:
   forming in the face of a semiconductor substrate plural semiconductor regions of a first and second conductivity type;
   forming a PMOS circuit in said semiconductor region of a first conductivity type;
   forming a plurality of doped buried layers underlying ones of said semiconductor regions;
   forming a doped semiconductor deep collector region in contact with one said buried layer;
   forming a bipolar transistor in a semiconductor region of a first conductivity type adjacent said deep collector;
   forming a doped isolation ring for isolating a portion of a semiconductor region of a second conductivity type, and forming said isolation ring in contact with one of said buried layers; and forming an NMOS device in said isolated semiconductor region, such that the bipolar transistor and said PMOS circuit are isolated from one another.

6. The method of claim 5 further including forming a backgate electrical contact in said isolated semiconductor region, and forming a different contact in electrical contact with a semiconductor region circumscribing said isolation ring, whereby a bias can be applied to the isolated semiconductor region which is different than a bias applied to said substrate.

7. The method of claim 6 further including connecting said backgate to a potential which is less than a potential connected to said semiconductor region circumscribing said isolation ring.

8. The method of claim 5 wherein said deep collector is formed during the same steps utilized in forming said semiconductor isolation ring.

9. The method of claim 5 wherein said isolated semiconductor region comprises a P-type epitaxial layer.

10. The method of claim 5 further including forming a well of semiconductor material in said isolated semiconductor region, said well being of a different conductivity type semiconductor material than that of said isolated semiconductor region, and forming a PMOS circuit in said well.

11. A method for fabricating a bipolar-CMOS circuit, comprising the steps of:

forming on a P-type semiconductor substrate a number of N-type buried layers;

forming on said substrate and on said buried layers an epitaxial layer of P-type semiconductor material;

forming in said epitaxial layer a first and second N-type semiconductor well in electrical contact with a first and second said buried layers;

forming a bipolar transistor in one said N-type semiconductor well;

forming a PMOS transistor in a different said N-type semiconductor well;

forming an N-type isolation ring around a region of said epitaxial layer and forming said N-type isolation ring in electrical contact with one said buried layers;

forming an NMOS transistor in said isolated epitaxial layer;

forming a CMOS circuit by interconnecting said PMOS transistor to said NMOS transistor;

forming a backgate contact to said isolated epitaxial material of said NMOS transistor; and forming a different contact to said substrate so that said backgate and said substrate can be connected to different voltages.

12. The method of claim 11 further including forming a deep collector associated with said bipolar transistor and forming said deep collector in contact with a buried layer underlying said bipolar transistor.

13. The method of claim 12 further including forming said deep collector by the same process steps utilized in forming said isolation ring.

14. The method of claim 13 further including forming said deep collector substantially simultaneously as said isolation ring is formed.

15. The method of claim 11 further including forming an NPN transistor in said one N-type semiconductor well.

* * * * *